(12) United States Patent
Luk et al.

(10) Patent No.: US 11,432,407 B2
(45) Date of Patent: Aug. 30, 2022

(54) ELECTRICAL COMPONENT PACKAGE WITH REINFORCED MOLDED PINS

(71) Applicants: XFMRS, Inc., Camby, IN (US); Tung Kong Luk, Tsuen Wan (HK); Yu Kun Liao, GuangDong (CN)

(72) Inventors: Tung Kong Luk, Tsuen Wan (HK); Yu Kun Liao, GuangDong (CN)

(73) Assignee: XFMRS, Inc., Camby, IN (US)

( * ) Notice: Subject to any disclaimer, the term of this patent is extended or adjusted under 35 U.S.C. 154(b) by 880 days.

(21) Appl. No.: 16/161,707

(22) Filed: Oct. 16, 2018

(65) Prior Publication Data
US 2019/0053382 A1    Feb. 14, 2019

Related U.S. Application Data

(63) Continuation-in-part of application No. 15/337,180, filed on Oct. 28, 2016, now Pat. No. 10,531,573.
(Continued)

(51) Int. Cl.
| | |
|---|---|
| H05K 3/30 | (2006.01) |
| H01F 17/06 | (2006.01) |
| H01F 27/02 | (2006.01) |
| H05K 3/34 | (2006.01) |
| H01F 27/28 | (2006.01) |
| H01F 27/29 | (2006.01) |

(52) U.S. Cl.
CPC .......... *H05K 3/301* (2013.01); *H01F 17/062* (2013.01); *H01F 27/027* (2013.01); *H01F 27/2828* (2013.01); *H01F 27/292* (2013.01); *H05K 3/3421* (2013.01); *H05K 3/3426* (2013.01)

(58) Field of Classification Search
CPC .... H05K 3/301; H05K 3/3421; H01F 17/062; H01F 27/027
See application file for complete search history.

(56) References Cited

U.S. PATENT DOCUMENTS

| | | |
|---|---|---|
| 3,076,165 A | 1/1963 | Weyrich |
| 4,092,622 A | 5/1978 | Widemann |
| (Continued) | | |

FOREIGN PATENT DOCUMENTS

| | | | |
|---|---|---|---|
| CN | 203706829 U | * | 7/2014 |
| CN | 204144030 U | * | 2/2015 |
| CN | 205378371 U | * | 7/2016 |

*Primary Examiner* — Mang Tin Bik Lian
*Assistant Examiner* — Malcolm Barnes
(74) *Attorney, Agent, or Firm* — Maginot, Moore & Beck LLP

(57) ABSTRACT

An electronic device package includes a molded case, a plurality of leads and a case lid. The molded case includes integrally formed side walls, end walls, and a bottom wall, which together define an interior for components. Each side wall includes top and bottom portions. The top portion includes first and second surfaces extending downward from a top edge of the side wall. The bottom portion has a top surface that extends away from the interior, a third surface extending downward from the top surface to a bottom edge, and a fourth surface extending downward from the second surface to the bottom wall. The leads are molded in the side wall from the bottom edge to the top edge. Each lead has an end extending above the top edge, and another end extending along the bottom edge of the side wall. The case lid is engaged with the molded case.

20 Claims, 15 Drawing Sheets

Related U.S. Application Data

(60) Provisional application No. 62/589,556, filed on Nov. 21, 2017.

(56) References Cited

U.S. PATENT DOCUMENTS

| | | | |
|---|---|---|---|
| 5,294,826 A | 3/1994 | Marcantonio | |
| 5,446,958 A | 9/1995 | Hoang | |
| 5,581,118 A | 12/1996 | Mays | |
| 6,118,364 A | 9/2000 | Hashimoto | |
| 6,133,525 A | 10/2000 | Yang et al. | |
| 6,208,232 B1 | 3/2001 | Chen | |
| 6,225,560 B1 | 5/2001 | Machado | |
| 6,518,501 B1 | 2/2003 | Kawahara | |
| 6,593,840 B2 | 7/2003 | Morrison | |
| 7,060,611 B1 * | 6/2006 | Lin | H01F 41/10 |
| | | | 438/660 |
| 7,326,084 B1 | 2/2008 | Chen | |
| 7,948,771 B2 | 5/2011 | Zhang | |
| 8,031,040 B1 | 10/2011 | Folker | |
| 8,203,853 B2 * | 6/2012 | Chen | H01R 13/719 |
| | | | 361/811 |
| 8,619,436 B2 | 12/2013 | Zhang | |
| 8,723,308 B2 | 5/2014 | Yang | |
| 8,854,167 B2 * | 10/2014 | Lin | H05K 5/0095 |
| | | | 336/96 |
| 9,844,154 B1 * | 12/2017 | Pan | H01R 12/57 |
| 2001/0041424 A1 | 11/2001 | Matsuura | |
| 2002/0036224 A1 * | 3/2002 | Siu | H05K 3/301 |
| | | | 228/110.1 |
| 2010/0142173 A1 | 6/2010 | Chen | |
| 2013/0076455 A1 * | 3/2013 | Chen | H01R 13/7193 |
| | | | 333/181 |
| 2013/0178104 A1 * | 7/2013 | Lin | H01R 9/22 |
| | | | 439/626 |
| 2014/0196540 A1 | 7/2014 | Martizon | |
| 2014/0340184 A1 | 11/2014 | Itoh | |
| 2015/0327385 A1 * | 11/2015 | Fan | H01F 27/027 |
| | | | 211/26 |
| 2016/0172316 A1 | 6/2016 | Taguchi | |
| 2017/0110232 A1 * | 4/2017 | Pan | H01F 27/027 |

* cited by examiner

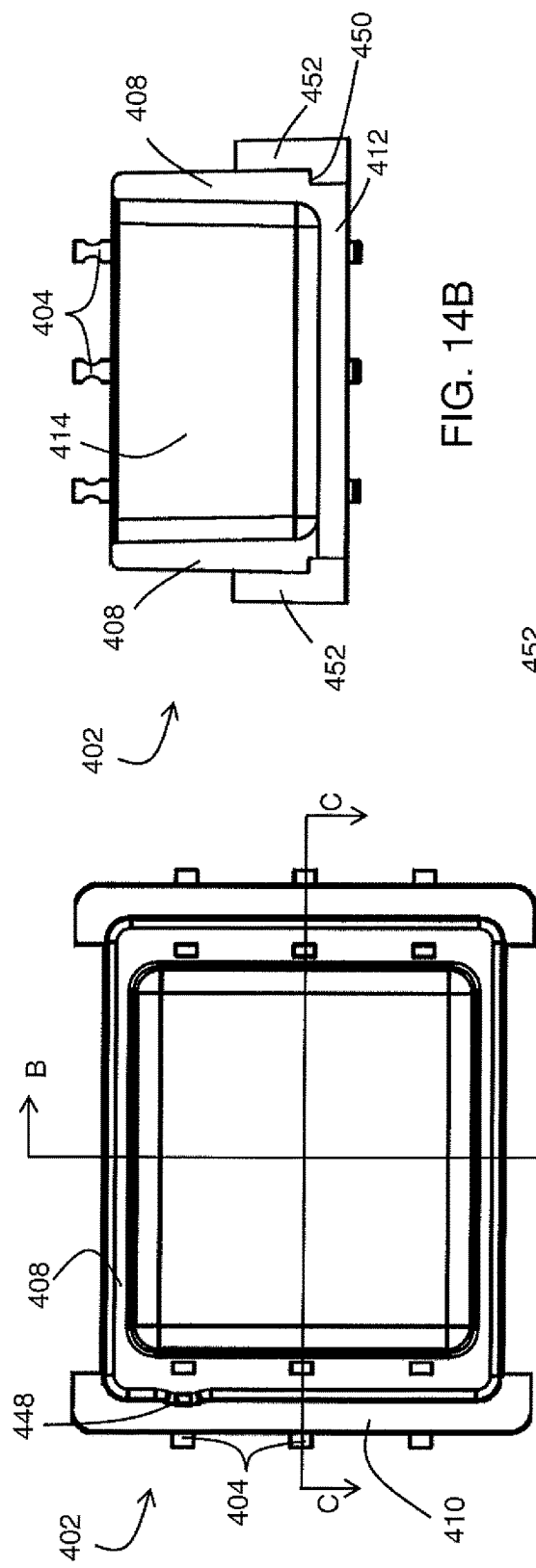
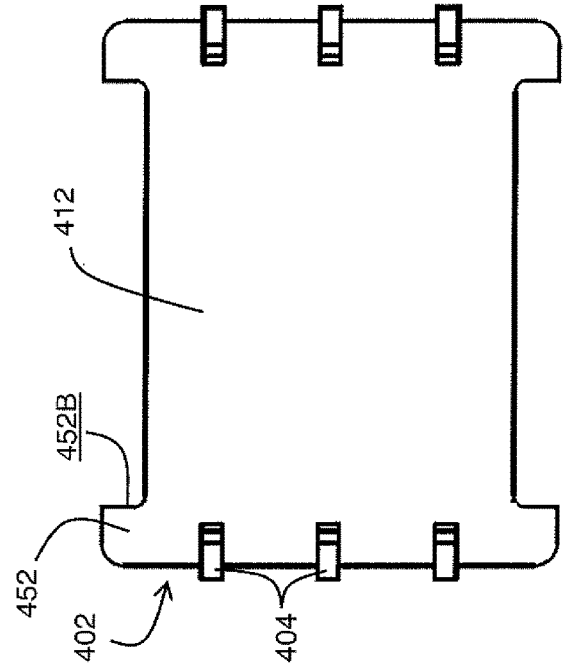
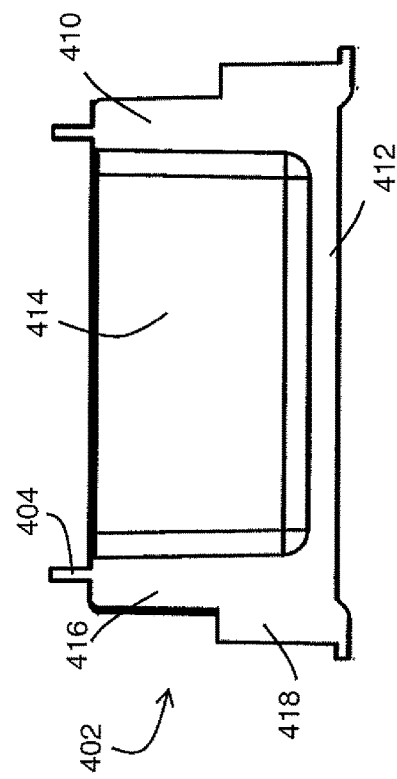
FIG. 14B
FIG. 14D
FIG. 14A
FIG. 14C

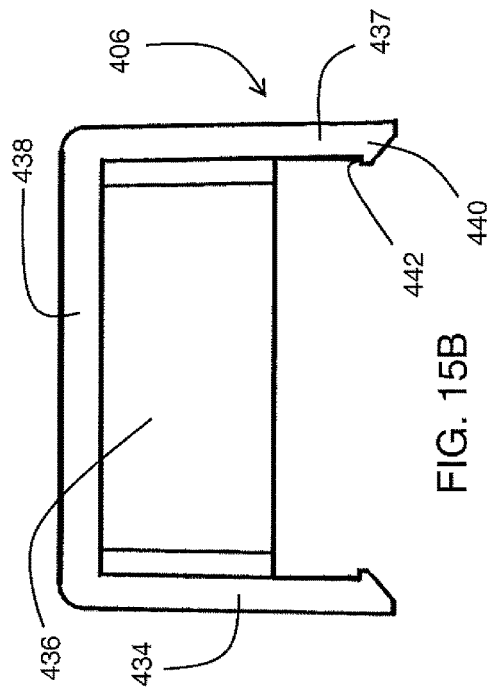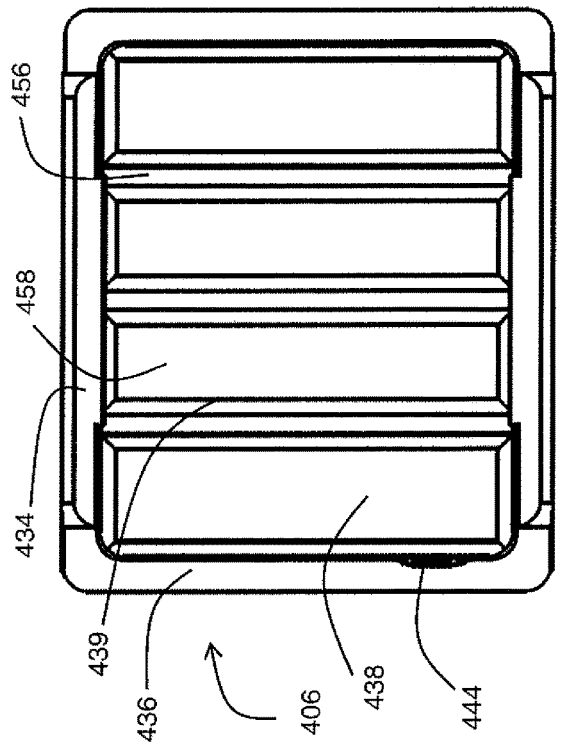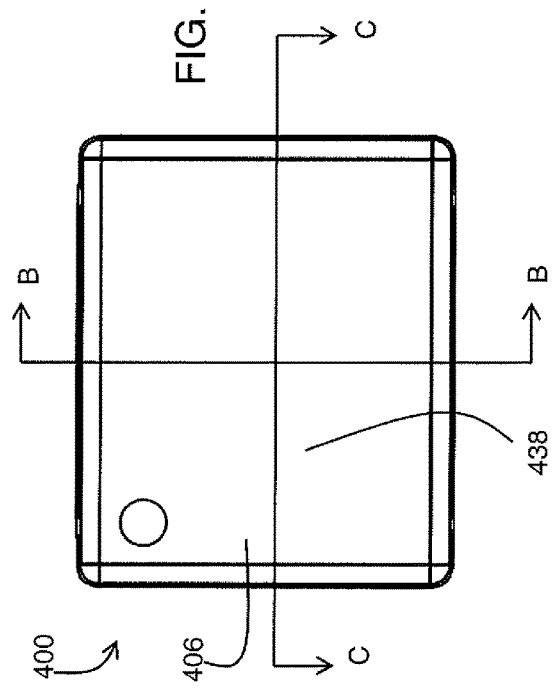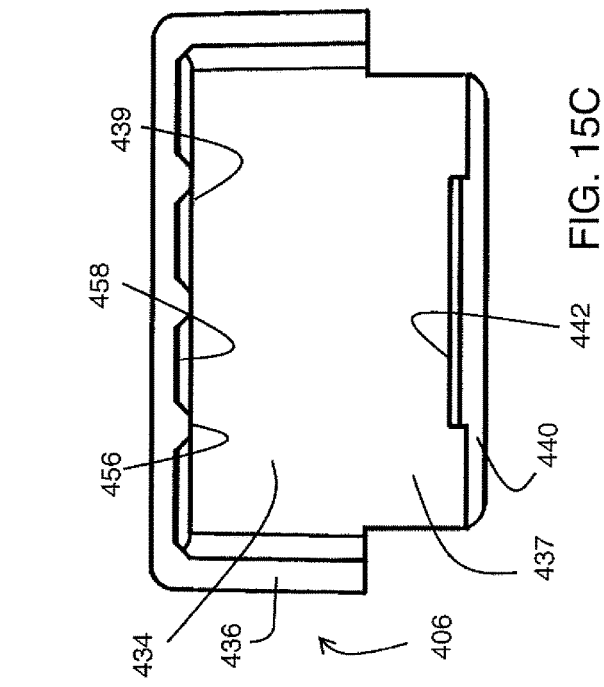

ELECTRICAL COMPONENT PACKAGE WITH REINFORCED MOLDED PINS

CLAIM OF PRIORITY

This application claims priority to U.S. Provisional Application No. 62/589,556, filed on Nov. 21, 2017, the disclosure of which is incorporated herein by reference in its entirety.

FIELD OF THE INVENTION

The present disclosure relates generally to packages for electrical components, and in particular, for packages for mounting electrical components to a circuit board.

BACKGROUND

Surface mount technology is a technology for mounting electrical and electronic components to a printed circuit board. In many cases, the electronic components that are mounted on the printed circuit board are arranged in packages having conductive pins. The package is often in the form of a housing in which digital electronic devices, processors, transistors, and groups of analog devices are contained.

The surface mount process includes placing such component packages at predetermined locations on the printed circuit board such that the conductive pins contact predetermined traces on the printed circuit board. The board then undergoes a soldering process, such as an infrared (IR) reflow process, which distributes solder to electrically and physically connect pins of the packages onto conductors on the printed circuit board at the predetermined locations.

Dual in-line surface mount packages are a form of surface mount package that includes a case or container and two rows of surface mount pins or leads. The case can contain a chip, passive electrical components and/or RF components, among things. One type of package can include small coils, which are used for chokes or transformers. Such devices include one or more conductive coils wrapped around a toroidal core. The ends of the wires of the conductive coils are typically electrically connected to respective surface mount pins, to allow circuit connection through the devices. The pins, in turn, are soldered to conductive traces on the printed circuit board as discussed above.

Such devices are known, but may suffer from issues during circuit board assembly that lead to unreliability. Other known devices require manufacturing steps that can lead to damage, or are otherwise complex and costly.

One known device for housing transformers in a surface mount package is an open bottom transformer case disclosed in U.S. Pat. No. 5,656,985 to Lu. U.S. Pat. No. 5,656,985 shows a surface mount package including transformers in an open bottom molded package. The coils of the transformers are connected to dual-in-line pins, which have been bent in a gull wing design. The pins are molded into the case, but are then subject to multiple bends after molding. The long, gull-wing shaped pin can be prone to damage because of the length of metal that is cantilevered from the body of the case. Such damage can occur before or during placement.

Other designs have been proposed, but which contain similar drawbacks, and/or introduce even more complexity in the manufacturing process.

SUMMARY

At least some embodiments of the present invention improve upon the state of the art by providing a case in which the surface mount pins extend along a bottom edge of the case, thereby substantially eliminating the risk of bending. Other embodiments include other or additional features that result in manufacturing and/or use advantages.

A first embodiment is an electronic device package that includes a molded case and a plurality of leads. The molded case includes integrally formed side walls, end walls, and a top wall, the side walls, end walls and top wall defining an interior for receiving one or more electronic components. Each side wall includes a top portion, an intermediate portion, and a bottom portion. The top portion includes plate-like structure having first and second surfaces extending downward from the top wall. The intermediate portion includes a shelf structure having a shelf surface, which extends from the first surface in a direction away from the interior, and a third surface, which extends downward from the shelf surface. The bottom portion extends downward from the intermediate portion. The leads are molded at least in part of the intermediate portion. Each lead has a first end portion exposed in the interior, and a second end portion extending along a bottom edge of the bottom portion.

Another embodiment is an electronic device package includes a molded case, a plurality of leads and a case lid. The molded case includes integrally formed side walls, end walls, and a bottom wall, which together define an interior for components. Each side wall includes top and bottom portions. The top portion includes first and second surfaces extending downward from a top edge of the side wall. The bottom portion has a top surface that extends away from the interior, a third surface extending downward from the top surface to a bottom edge, and a fourth surface extending downward from the second surface to the bottom wall. The leads are molded in the side wall from the bottom edge to the top edge. Each lead has an end extending above the top edge, and another end extending along the bottom edge of the side wall. The case lid is engaged with the molded case.

The above-described features and advantages, as well as others, will become more readily apparent to those of ordinary skill in the art by reference to the following detailed description and accompanying drawings.

BRIEF DESCRIPTION OF THE DRAWINGS

FIG. 14A shows a top plan view of the molded case of the package of FIG. 13;

FIG. 14B shows a cutaway view of the molded case of the package FIG. 13 cut along the lines B-B in FIG. 14A;

FIG. 14C shows a cutaway view of the molded case of the package of FIG. 13 cut along the lines C-C in FIG. 14A;

FIG. 14D shows a bottom plan view of the molded case of the package of FIG. 13;

FIG. 15A shows a top plan view of the case lid of the package of FIG. 13;

FIG. 15B shows a cutaway view of the case lid of the package of FIG. 13 cut along the lines B-B in FIG. 15A;

FIG. 15C shows a cutaway view of the case lid of the package of FIG. 13 cut along the lines C-C in FIG. 15A; and FIG. 15D shows a bottom plan view of the case lid of the package of FIG. 13.

DETAILED DESCRIPTION

Figure 1:
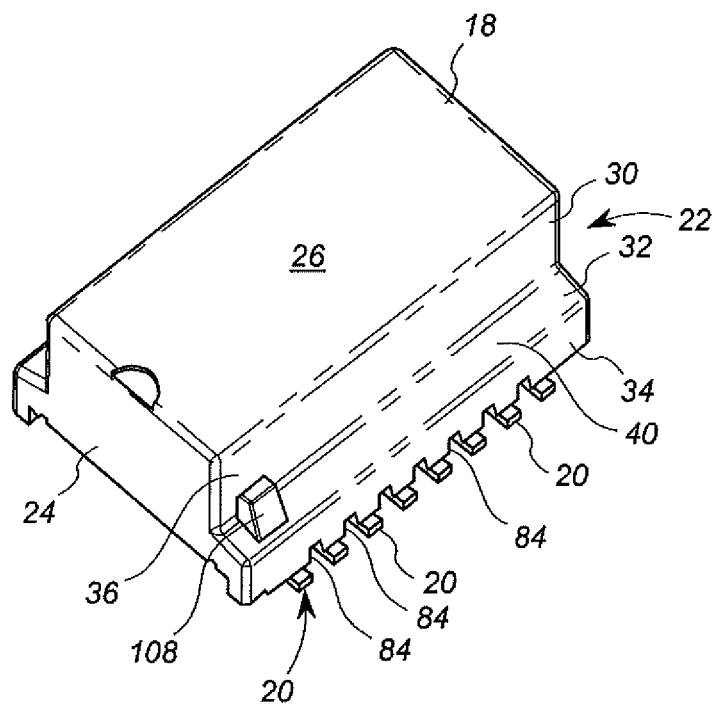
FIG. 1 shows a top perspective view of an electronic device package according to a first exemplary embodiment of the invention.
Figure 2:
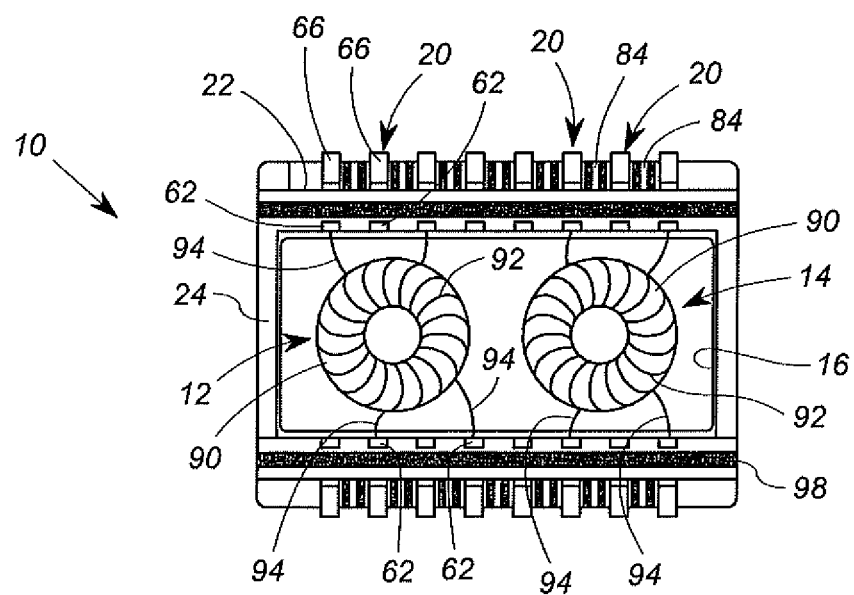
FIG. 2 shows a bottom plan view of the electronic device package of FIG. 1, with two electronic devices mounted therein.
Figure 3:
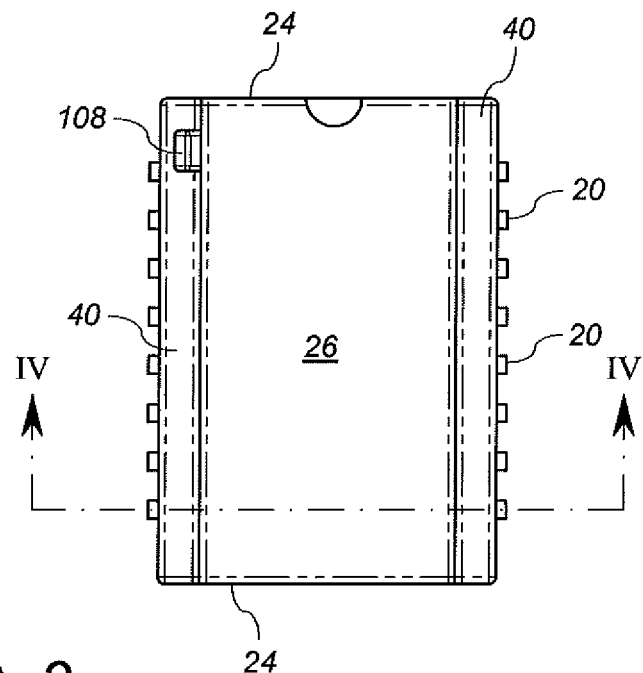
FIG. 3 shows a top plan view of the electronic device package of FIG. 1.

FIG. 1 shows a top perspective view of a first embodiment of an electronic device package 10 incorporating features of the invention. The first embodiment is arranged as a dual in-line package 10 having sixteen pins or leads 20. The package 10 is configured to house electrical components. To this end, FIG. 2 shows a bottom plan view of the package 10 having a first toroid 12 and a second toroid 14 mounted on the package 10. FIGS. 3-6 show other views of the package 10 without the toroids 12 and 14 mounted therein. Like elements in each of FIGS. 1-6 bear the same reference numbers.

With contemporaneous reference to FIGS. 1-6, the electronic device package 10 includes a molded case 18 and conductive pins or leads 20 molded into the case 18. To this end, the case 18 may be molded out of a suitable, non-electrically-conductive material. The leads 20 may be copper, or another suitable electrically conductive, and preferably pliable, material.

The case 18 includes integrally formed side walls 22, end walls 24, and a top wall 26. The top wall 26 in this embodiment has a rectangular shape. The side walls 22 extend generally downwardly from two opposite edges of the top wall 26, and the end walls 24 extend generally downwardly from the other two opposite edges of the top wall 26. Accordingly, the side walls 22, end walls 24, and top wall 26 define an interior 16 (shown in FIGS. 2, 4, and 6) of the case 18, which is configured to receive one or more electronic components mounted therein. In the example shown in FIG. 2, the first toroid 12 and the second toroid 14 are the electronic components mounted in the interior 16.

Figure 4:
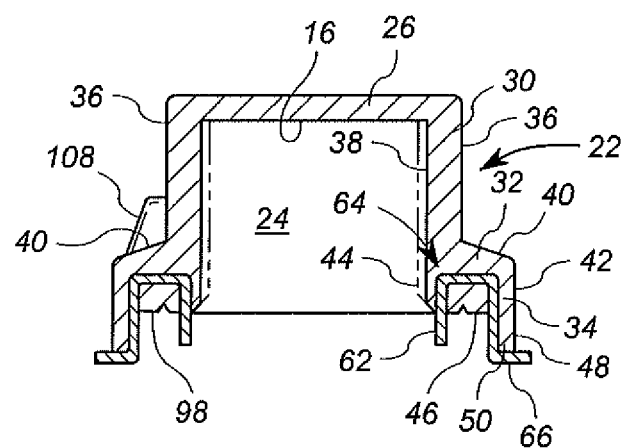
FIG. 4 shows a cutaway view of the electronic device package of FIG. 1 taken along line IV-IV of FIG. 3.

With specific reference to FIGS. 1 and 4, each side wall 22 includes a top portion 30, an intermediate portion 32, and a bottom portion 34. The top portion 30 comprises a plate-like structure having first and second surfaces 36, 38, which extend downwardly from the top wall 26. The top wall 26 also preferably defines a flat plate-like structure, but may be a plate-like structure having other shapes such as curved, arched, peaked, or even corrugated.

Referring again to the side walls 22, the first surface 36 of each of the top portions 30 defines an outwardly facing surface of the top portion 30, and the second surface 38 defines an inwardly facing surface of the top portion 30, such that the second surface 38 delimits the interior 16. In other words, the first and second surfaces 36, 38 are directly opposite surfaces of the top portion 30. In this embodiment, both the first and second surfaces 36, 38 extend vertically downwardly, and are in substantially parallel planes. However, it will be appreciated that the first and second surface 36, 38 can extend downwardly in a slightly or even moderate inclined manner. For molding purposes, any incline downward from the top wall 26 should be outward from the interior 16. It will also be appreciated that the surfaces 36, 38 need not be in parallel planes.

Figure 5:
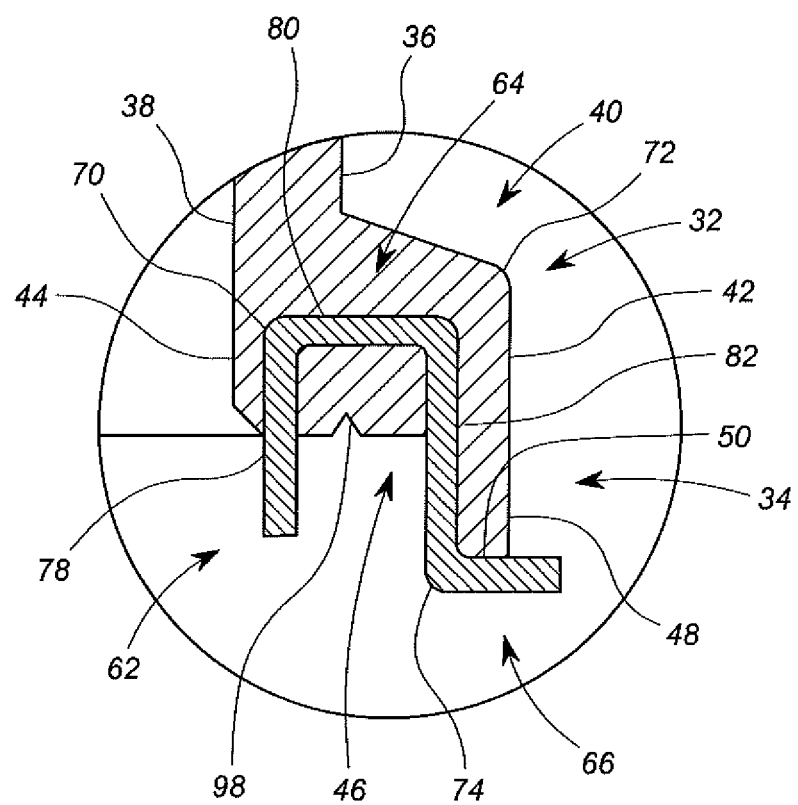
FIG. 5 shows an enlarged, fragmentary portion of the cutaway view of the electronic device package shown in FIG. 4.

With reference to FIGS. 4 and 5, the intermediate portion 32 of each side wall 22 includes a shelf structure having a shelf surface 40 and an outer surface 42. The shelf surface 40 extends downwardly and outwardly from the first surface 36 in a direction away from the interior 16, and the outer surface 42 extends downwardly from the shelf surface 40. The intermediate portion 32 in this embodiment also includes an inner surface 44 that extends downwardly in a coplanar manner from the second surface 38 of the top portion 30. The intermediate portion 32 also includes a bottom surface 46.

Due to the outward extension of the shelf surface 40 of the intermediate portion 32 from the first surface 36 of the top portion 30 and the coplanar extension of the inner surface 44 of the intermediate portion 32 from the second surface 38 of the top portion 30, the thickness of the intermediate portion 32 between the outer surface 42 and the inner surface 44 is greater than the thickness of the top portion 30. Moreover, the thickness of the intermediate portion 32 is greatest between the outer surface 42 and the inner surface 44 and is smallest between the inner surface 44 and the shelf surface 40 where the shelf surface 40 meets the first surface 36 of the top portion 30.

The bottom portion 34 of each side wall 22 extends downwardly from the intermediate portion 32, and includes an outer surface 48 and a bottom edge 50. The outer surface 48 of the bottom portion 34 extends downwardly in a coplanar manner from the outer surface 42 of the intermediate portion 32.

Referring again generally to the embodiment shown in FIGS. 1-6, each end wall 24 comprises a generally rectangular plate-like structure that extends from one side wall 22 to the opposing side wall 22, from the top wall 26 to a position level with the bottom surfaces 46 of the intermediate portions 32 of the side walls 22. Accordingly, because the side walls 22 extend beyond the bottom surface 46 of the intermediate portions 32 via the bottom portions 34, the side walls 22 extend further downwardly than do the end walls 24.

In the embodiment shown in FIGS. 1-6, the package 10 includes sixteen leads 20, eight of which are molded into each of the side walls 22, spaced apart from each other. In particular, as shown in FIGS. 4 and 5, the leads 20 are molded at least in part of the intermediate portion 32 of each side wall 22. Each lead 20 includes a first end portion 62, also referred to herein as a "first lead end" or "post," an intermediate portion 64, and a second end portion 66, also referred to herein as a "second lead end." Each first end portion 62 is arranged below the bottom surface 46 of the intermediate portion 32 of the side wall 22 so as to be exposed within the interior 16 of the case 18. More specifically, each first end portion 62 is positioned between the bottom portion 34 of each of the side walls 22 and extends downwardly beyond the bottom of each of the end walls 24. Each of the first end portions 62 does not, however, extend as far downwardly as the bottom edge 50 of the bottom portion 34 of each of the side walls 22.

The second end portion 66 of each lead 20 extends along and preferably abuts the bottom edge 50 of the bottom portion 34 and extends outwardly beyond the outer surface 48 of the bottom portion 34. Accordingly, each second end portion 66 extends downwardly and outwardly from the molded case 18. Moreover, the second end portion 66 of each lead 20 is arranged downwardly and outwardly relative to the first end portion 62 of each lead 20.

The intermediate portion 64 of each lead 20 extends upwardly from the first end portion 62 into the bottom surface 46 of the intermediate portion 32 of the side wall 22, extends thence laterally within the thicker intermediate portion 32 of the side wall 22 in a direction away from the interior 16, which is also in a direction toward the outer surface 42 of the intermediate portion 32, and extends thence downwardly, back through the bottom surface 46, and to the second end portion 66.

Thus, as shown in FIG. 5, the intermediate portion 64 of each lead 20 includes three bends or rounded corners 70, 72, 74. A first corner 70 defines the intersection of a first part 78 and a second part 80 of the intermediate portion 64 of the lead 20. The first part 78 is that part of the intermediate portion 64 which extends upwardly from the first end portion 62 and into the bottom surface 46, and the second part 80 is that part of the intermediate portion 64 which extends laterally within the thicker intermediate portion 32 of the side wall 22. A second corner 72 defines the intersection between the second part 80 and a third part 82. The third part 82 is that part of the intermediate portion 64 of the lead 20 that extends downwardly and toward the second end portion 66, through the bottom surface 46 of the intermediate portion 32 of the side wall 22. The third part 82 also extends along or partly inside an inner surface of the bottom portion 34 of the side wall 22, the inner surface directly opposite the outer surface 48 of the bottom portion 34 of the side wall 22. The third corner 74 defines the intersection of the third part 82 and the second lead end 66. The first, second, and third parts 78, 80, and 82, along with the first and second corners 70, 72, thus define a c-shape of the intermediate portion 64 of the lead 20. In other words, the intermediate portion 64 has a c-shape formed by the first, second, and third parts 78, 80, and 82.

One feature of the particular configuration of the package 10 described above is that only the third corner 74 of the lead 20 is exposed. In other words, only a single load-bearing bend of each lead 20 is exposed due to the disposition of the first and second corners 70, 72 that define the c-shape within the molded plastic of the intermediate portions 32 of the side walls 22. The result is a stronger device that is less liable to damage compared to prior art gull-wing lead designs, because the prior art gull-wing lead designs having multiple bends on load bearing portions of the leads.

Another feature of the particular configuration of the package 10 is that the second lead end 66, which is configured to be surface mounted to a printed circuit board, is structurally reinforced because it extends along the bottom edge 50 of the bottom portion 34 of the side wall 22. Thus, the downward pressure applied by placement of the package 10 on a printed circuit board, not shown, is less likely to damage the device compared to prior art designs wherein the contact portions of the leads are cantilevered in a gull-wing design.

The package 10 is configured and intended for use as a surface mount device. Accordingly, to surface mount the package 10 to a printed circuit board (not shown), the second lead ends 66 are typically electrically connected to traces of a printed circuit board using IR reflow processes. Because the IR reflow process can cause gasses to form or collect, proper ventilation of the interior 16 is desirable. To this end, as shown in FIGS. 1, 6 and 7, the bottom portion 34 of each side wall 22 includes a notch 84 defined in each of the spaces 86 (shown in FIG. 7) formed between adjacent leads 20.

More specifically, each space 86 is a portion of the bottom portion 34 of the side wall 22 between locations where the second end portions 66 of adjacent leads 20 extend from beneath the bottom portion 34 of the side wall 22. Each space 86 includes a notch 84, which extends through the bottom portion 34 of the side wall 22 to the interior 16, and extends upwardly toward the intermediate portion 32 of the side wall 22, but does not extend upwardly all the way to the intermediate portion 32 of the side wall 22. In other words, the entirety of each notch 84 is defined in the bottom portion 34 of the side wall 22.

Figure 6:
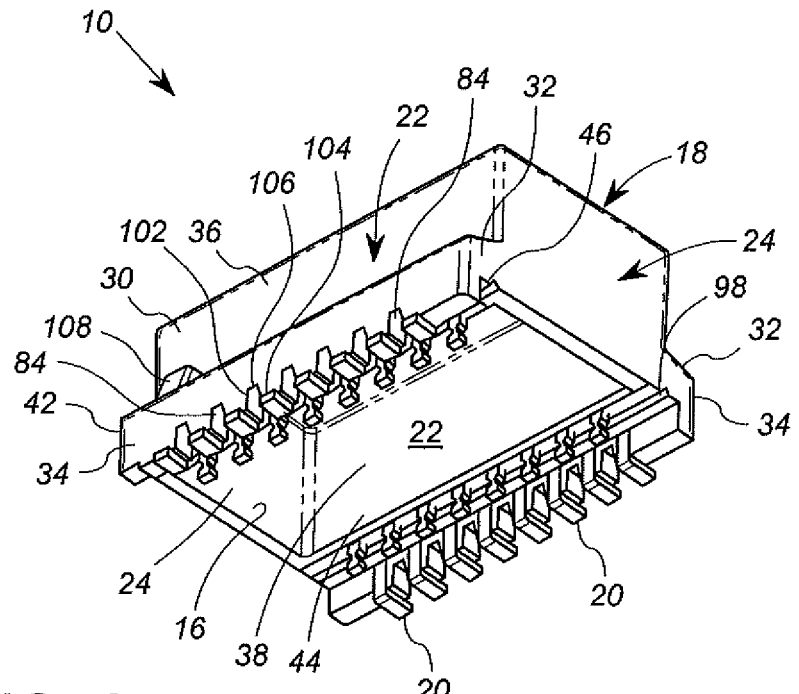
FIG. 6 shows a bottom perspective view of the electronic device package of FIG. 1.
Figure 7:
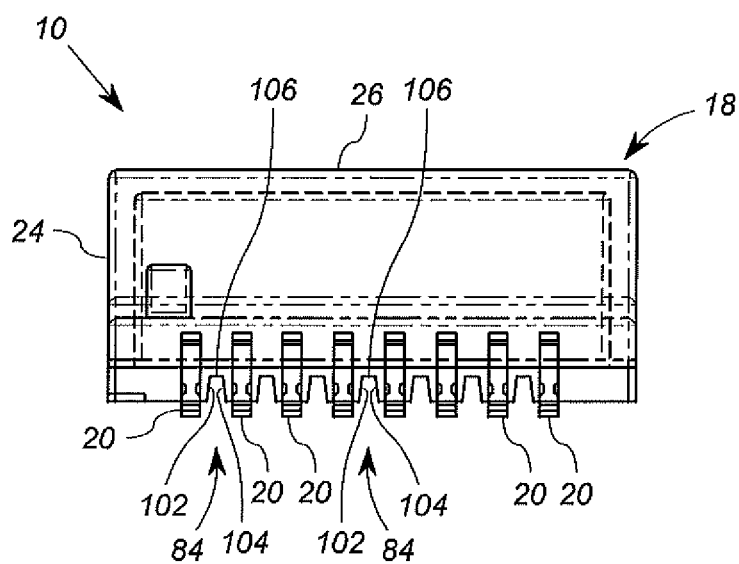
FIG. 7 shows a side perspective view of the electronic device package of FIG. 1.

Referring to FIGS. 6 and 7, each notch 84 is defined by inclined side walls 102, 104 that extend upwardly and slightly inwardly toward each other, and a top wall 106 that extends from the top of one of the inclined side wall 102 to the top of the other inclined side wall 104. The top wall 106 is disposed at a level that is just below the bottom surface 46 of the intermediate portion 32 of the side wall 22. As shown most clearly in FIG. 7, the lowest portion (that which is spaced farthest from the top wall 106) of each of the inclined side walls 102, 104 is spaced apart from the nearest lead 20 by a distance that is approximately 15% to 30% of the width of the space 86 between adjacent leads 20.

While some or all of the notches 84 may alternatively have other shapes, the trapezoidal shape of the notches 84 shown in FIGS. 1, 6 and 7 is particularly advantageous. Firstly, because the notch 84 is narrowest at or adjacent to the top wall 106, more material of the bottom portion 34 of the wall 22 is provided at or adjacent to the top wall 106. As a result, the trapezoidal shape provides additional structural support at the top of the notch 84 relative to the bottom of the notch 84. Secondly, because the notch 84 is widest at the bottom (spaced farthest from the top wall 106), the trapezoidal shape also provides increased gas flow space near the bottom of the notch 84.

As discussed above, the package 10 is configured to carry electronic devices, and preferably devices that include at least one wire coil wrapped around a toroid core. Referring again to FIG. 2, for example, the first toroid 12 includes a donut-shaped toroidal core 90, and wires 92 wrapped around core 90. Each wire 92 includes wire ends 94, and each wire end 94 is electrically and physically directly coupled to the first lead end 62 of a respective lead 20. In this manner, electrical connections from a circuit board to the first toroid 12 can be accomplished by soldering traces of the printed circuit board to the second lead end 66 of select leads 20 of the package 10, which in turn conduct electrical signals to the first lead end 62 and hence wires 92 of the first toroid 12.

Another feature of the embodiment of FIGS. 1-6 relates to the manufacturing process, and specifically, coupling the wire ends 94 to the respective first lead ends 62 after installation of the toroids 12, 14 in the interior 16 of the package 10. In general, once the toroids 12, 14 are mounted in the interior 16 (by epoxy, or another means of mounting), the wire ends 94 are wrapped around respective first lead ends 62. To enable manipulation of the wire end 94 around the posts or lead ends 62, excess wire is provided. After the wire end 94 is wrapped around the respective post 62, the excess wire must be cut to avoid spurious contact with other lead ends 62, wire ends 94, or even with traces of the printed circuit board on which package 10 is mounted.

In accordance with embodiments of the present disclosure, the bottom surface 46 of the intermediate portion 32 of each of the side walls 22 includes a channel 98 that extends in the bottom surface 46 along a length of the side wall 22. (See FIGS. 2 and 4-6). Each channel 98 is disposed between a position at which the intermediate portion 64 of the lead 20 extends to the first lead end 62 and a position at which the intermediate portion 64 of the lead 20 extends towards the second lead end 66. In other words, the channel 98 is disposed between the first part 78 and the third part 82 of the intermediate portion 64 of the lead 20. Accordingly, each channel 98 runs underneath the second part 80 of all of the leads 20 that are arranged along the same side wall 22 as the channel 98.

Put another way, the channel 98 is disposed in the bottom surface 46 at a position that is between the inner surface 44 of the intermediate portion 32 and the outer surface 42 of the shelf structure of the intermediate portion 32 of the side wall 22. The inner surface 44 and the outer surface 42 are spaced apart from one another by a distance. In at least one embodiment, the channel 98 is disposed at a position that is approximately one-third of the distance from the inner surface 44. In alternative embodiments, the channel 98 can be disposed at a position that is nearer or farther from the inner surface 44. In any event, as described in further detail below, the channel 98 provides a guide and/or receptacle for a linear cutting blade, not shown, to trim the excess wire from the wire ends 94. To this end, the channel 98 is preferably v-shaped, and relatively shallow.

Referring to FIG. 2, it will be appreciated that after the wire ends 94 are wrapped around the first lead ends 62, the remaining excess wire for each wire end 94 is laid perpendicularly across the closest one of the channels 98. A straight edge blade is then thrust into or along each channel 98 to cut the excess wire. This process allows for multiple wire ends 94 to be trimmed with a single manufacturing step. In the case of the embodiment shown in FIG. 2, a single cutting step on one channel 98 trims four wire ends 94, and a single cutting step on the opposite channel 98 trims four more wire ends 94. In contrast, in the prior art, each of the four wire ends 94 on each side would have been trimmed individually. Thus, the channels 98 reduce eight trimming procedures to only two trimming procedures. It can be understood that in devices having more wires, the gain in efficiency is even greater.

Still another feature of the package 10 of FIGS. 1-6 is an orientation indicating feature 108 configured to aid in automated placement of the package 10. (See FIGS. 1, 3, 4, and 6). The orientation indicating feature 108 is a discontinuity molded into the shelf surface 40 of the intermediate portion 32 and/or the first surface 36 of the top portion 30 of the side wall 22, located in a position that is asymmetrical along the length and width of the package 10. The asymmetrical location of the orientation indicating feature 108, enables automated pick-and-place equipment, as well as automated or human inspection processes, to identify the proper orientation of the pins 20. Such a feature may also be used to confirm locations of the wire ends 94 on the first lead ends 62.

The embodiment of the molded case 18 shown in FIGS. 1-7 is particularly well suited for the orientation indicating feature 108, because the laterally extending shelf surface 40 provides a location for such a feature that does not increase the vertical or lateral footprint of the package 10. Moreover, placing the orientation indicating feature 108 on the shelf surface 40 enables the orientation indicating feature 108 to be readily molded into the molded case 18, because the orientation indicating feature 108 does not include any overhangs or other difficult-to-mold features.

Figure 8:
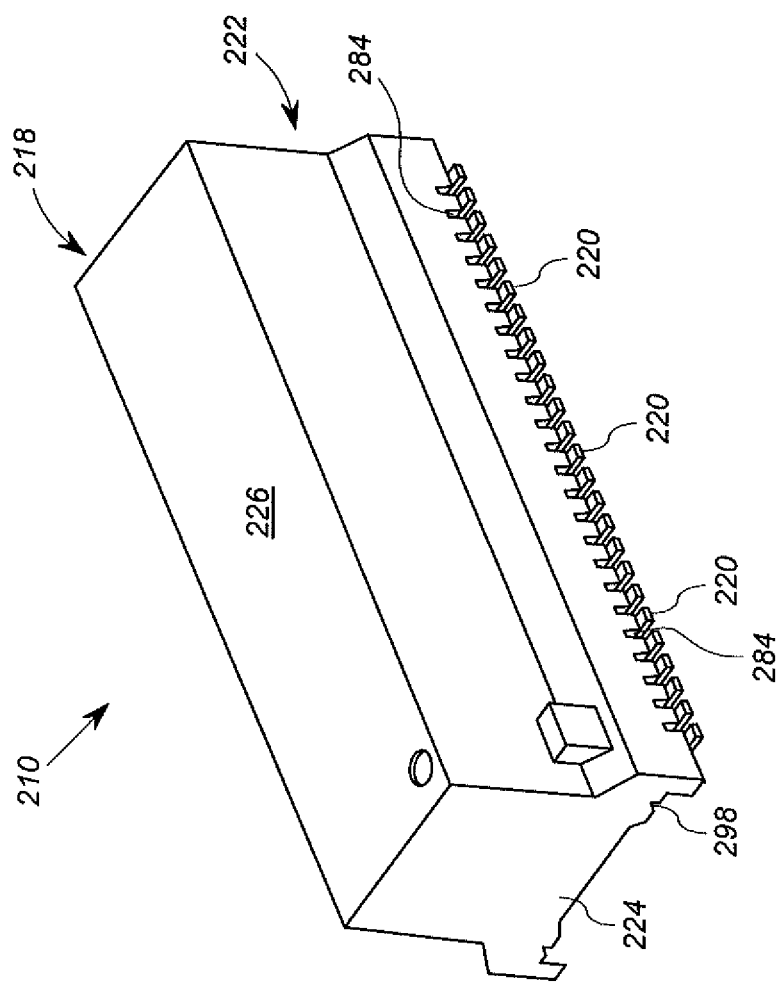
FIG. 8 shows a top perspective view of a second exemplary embodiment of an electronic device package according to the invention.
Figure 9:
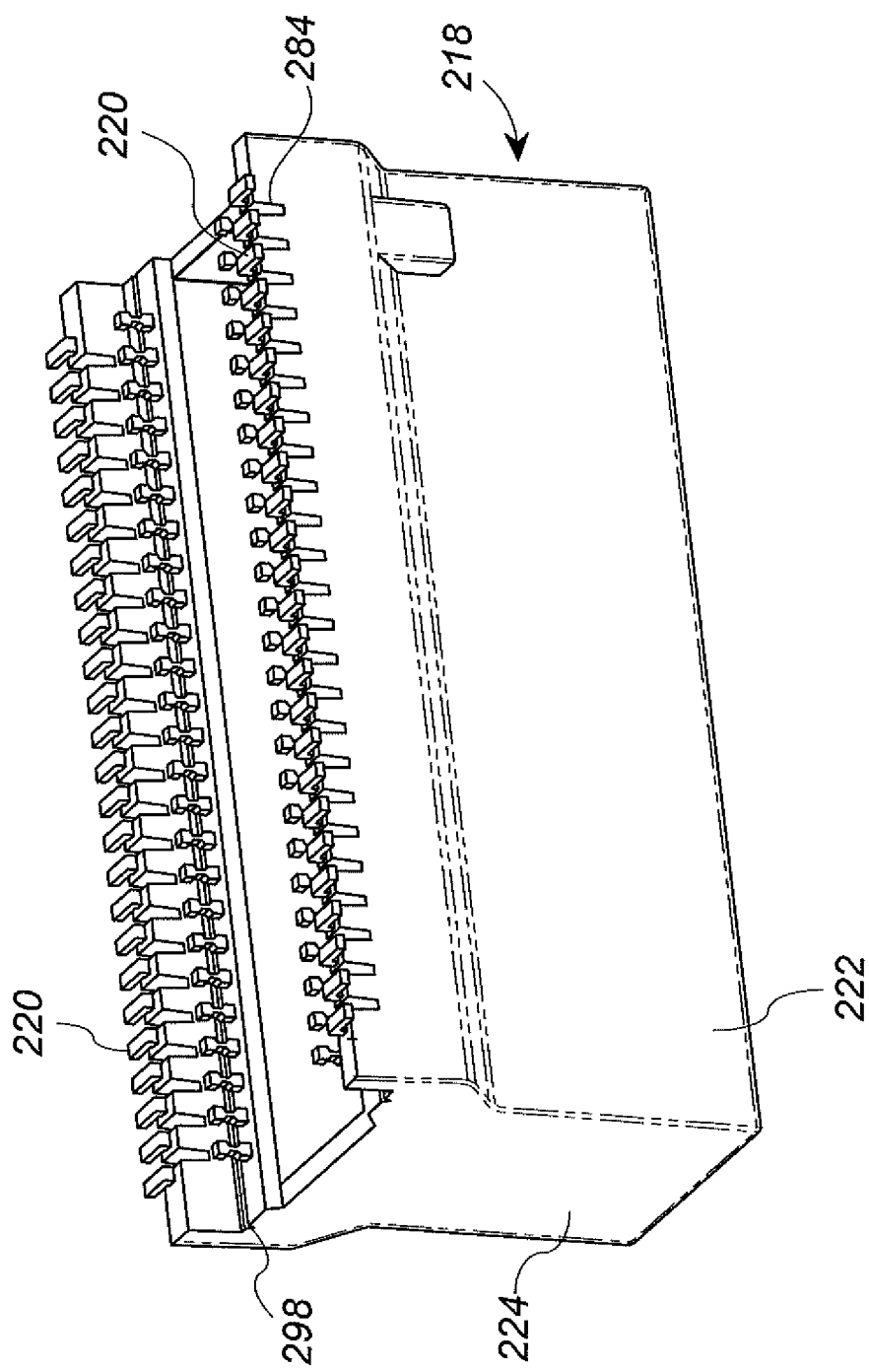
FIG. 9 shows a bottom perspective view of the electronic device package of FIG. 8.

It will be appreciated that the various features of the embodiment of FIGS. 1-7 may be incorporated into packages having more or fewer than sixteen pins 20. For example, FIGS. 8 and 9 show perspective views of a so-called 40-pin package 210 having a molded case 218 and forty leads 220 molded therein. The package 210 incorporates side walls 222 having features and structure similar to those of the side walls 22 of the embodiment shown in FIGS. 1-7. The package 210 also includes end walls 224 and a top wall 226 analogous to end walls 24 and top wall 26, respectively. The pins 220 are molded into the case 218 in the same manner described above that the pins 20 are molded into the molded case 18. The case 218 also includes a cutting channel 298 similar to the channel 98, and notches 284 similar to the notches 84.

FIGS. 8 and 9 illustrate how readily one or more advantageous features of the embodiment of FIGS. 1-7 may be incorporated to packages with more or fewer than sixteen pins. These advantages include the decreased likelihood of damage to leads or pins, as compared to older design. It will be appreciated, however, that some of the advantages described herein may occur independently of others. For example, the advantages of the placement feature 108 and/or the feature of the cutting channel 98, 298 may be employed with pins or leads having a different shape.

FIGS. 10-12B show an alternative embodiment of an electronic device package 300 that includes a case 302 and a lid 306. In the embodiment of the package 300 shown in FIGS. 10-12B, in contrast with the embodiment of the package 10 shown in FIGS. 1-7 and described above, the transformers or other electronic components are placed on the bottom of the case 302, and the lid 306 covers the components and bottom of the case 302.

Figure 10:
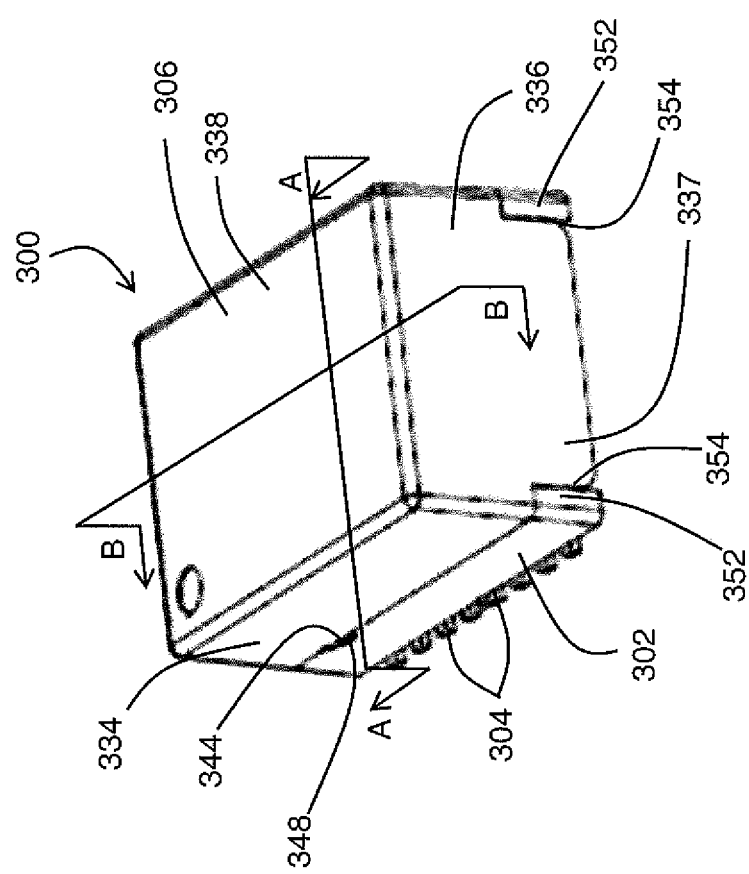
FIG. 10 shows a perspective view of an alternative electronic device package.
Figure 11A:
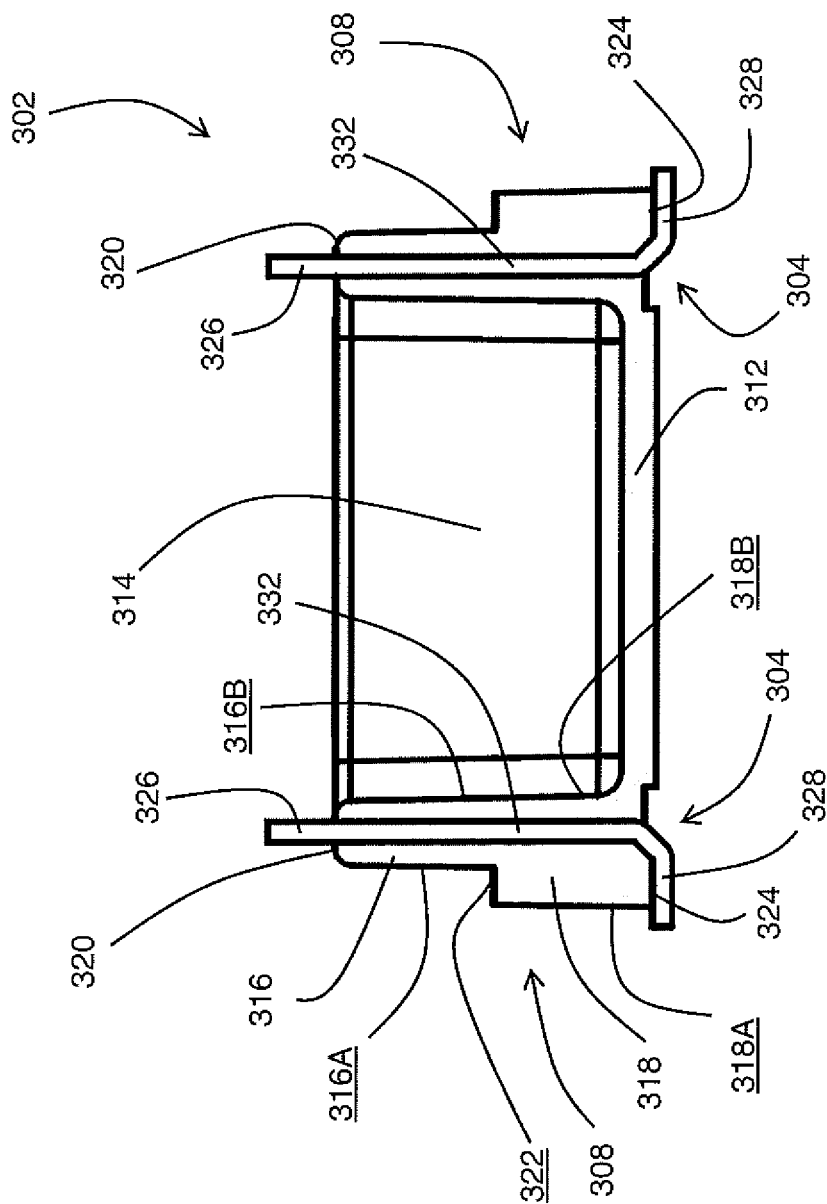
FIG. 11A shows a cutaway view of the molded case of the package of FIG. 10 taken along line A-A.
Figure 11B:
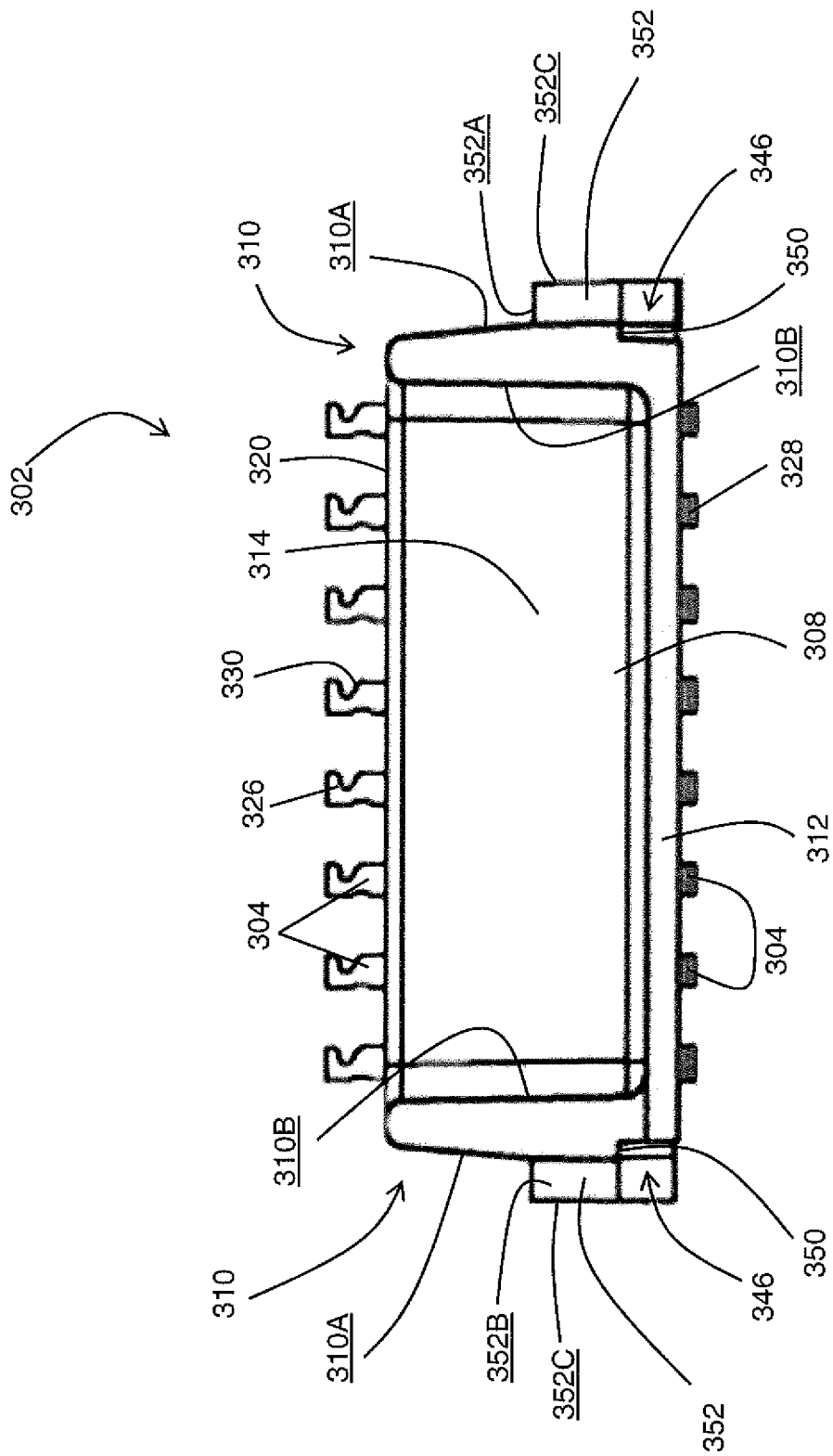
FIG. 11B shows a cutaway view of the molded case of the package of FIG. 10 taken along line B-B.
Figure 11C:
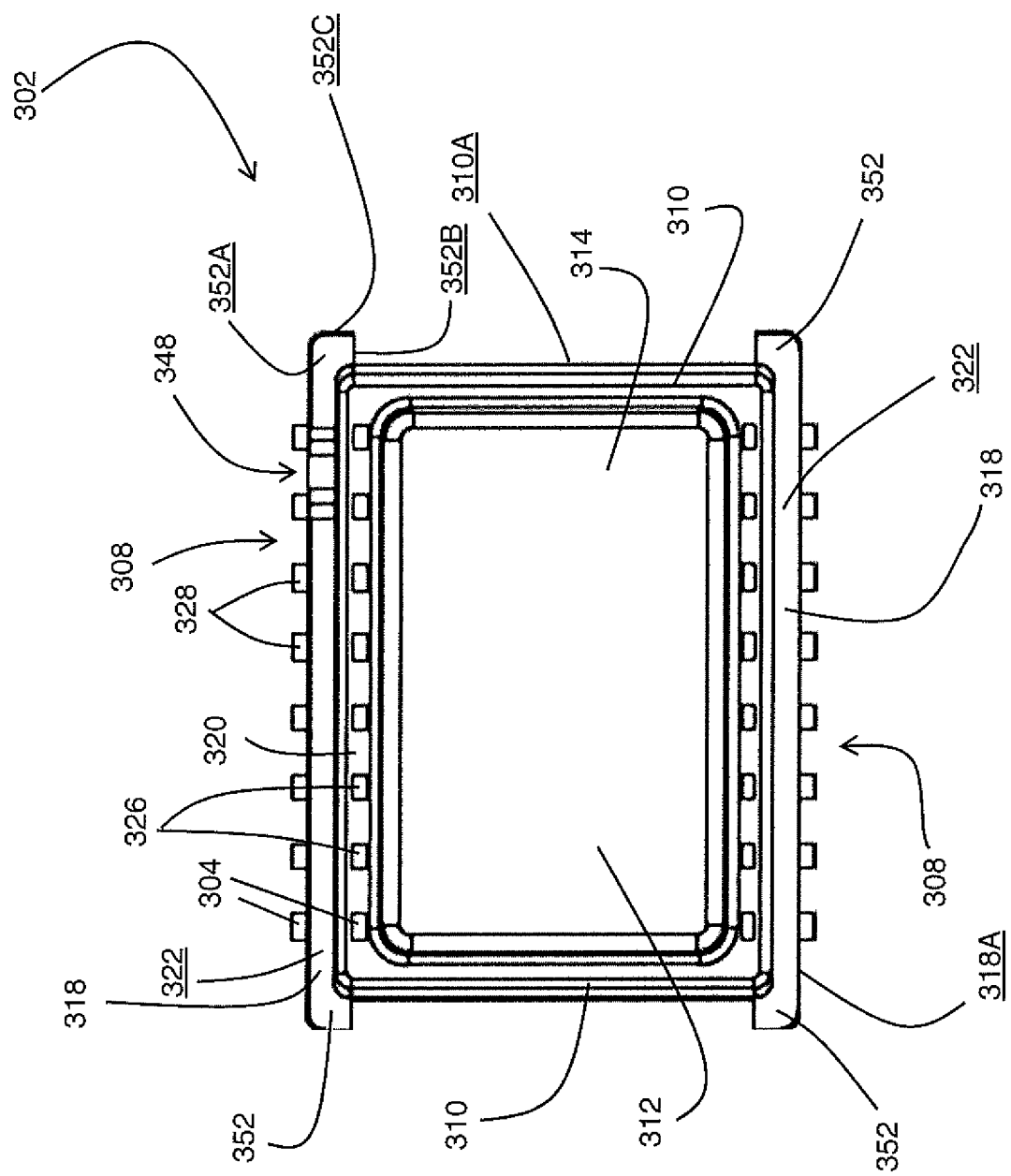
FIG. 11C shows a top plan view of the molded case of the package of FIG. 10.
Figure 11D:
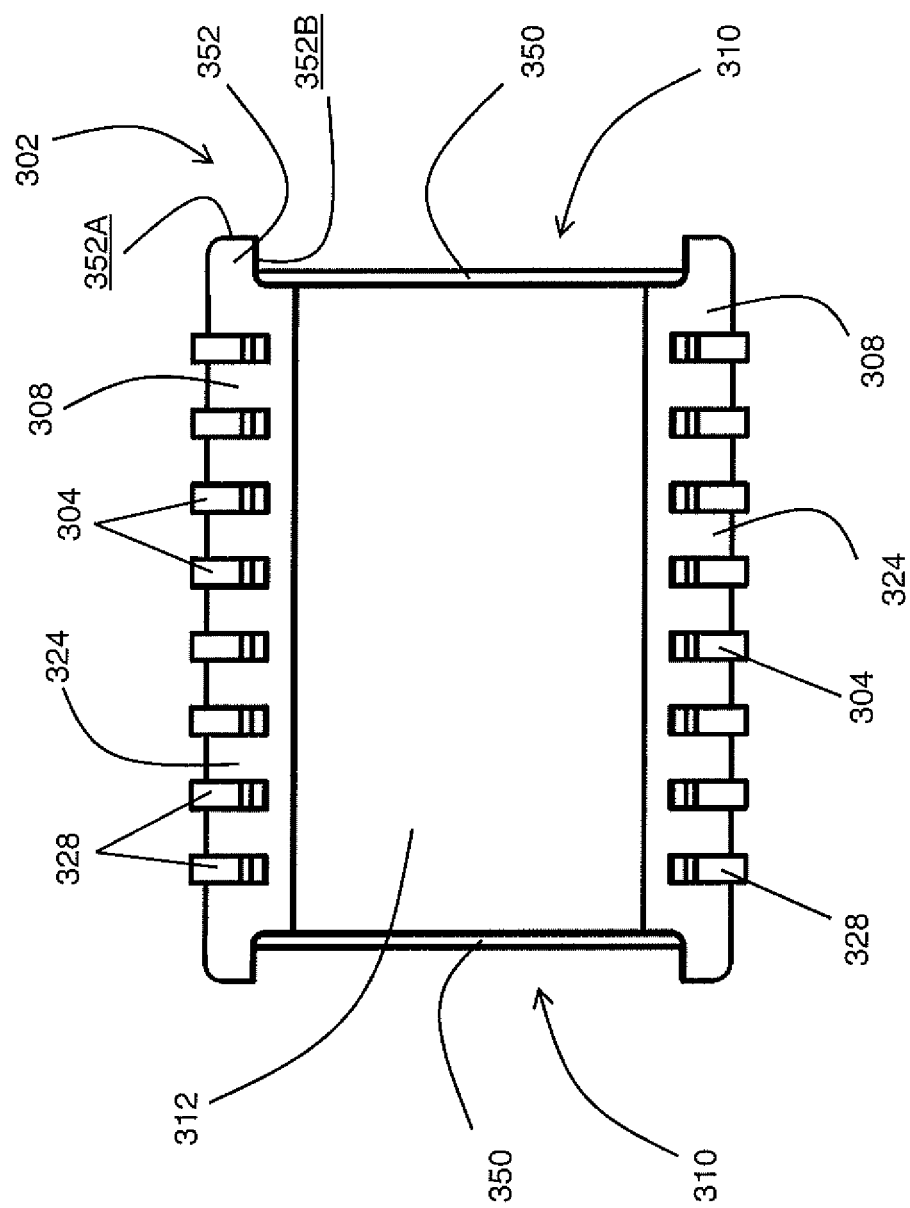
FIG. 11D shows a bottom plan view of the molded case of the package of FIG. 10.
Figure 12A:
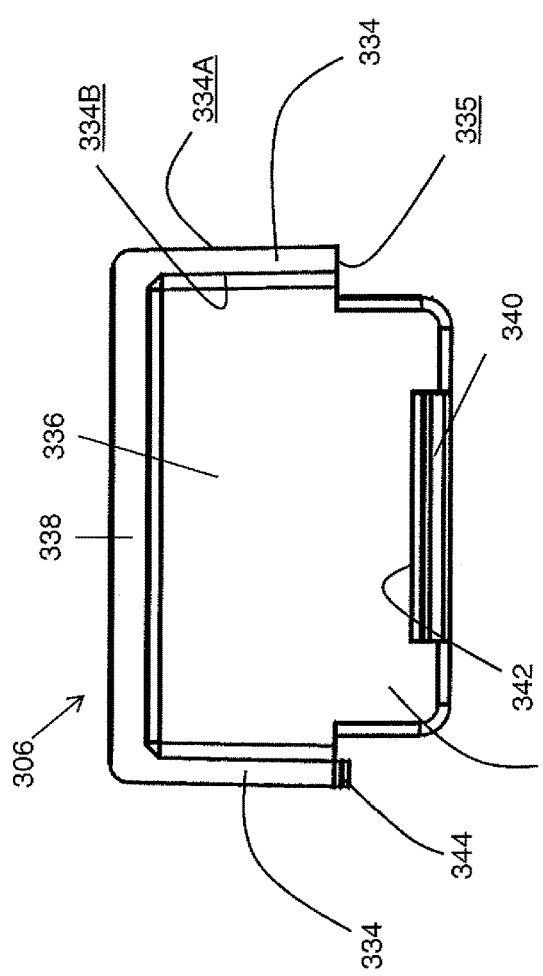
FIG. 12A shows a cutaway view of the case lid of the package of FIG. 10 taken along line A-A.
Figure 12B:
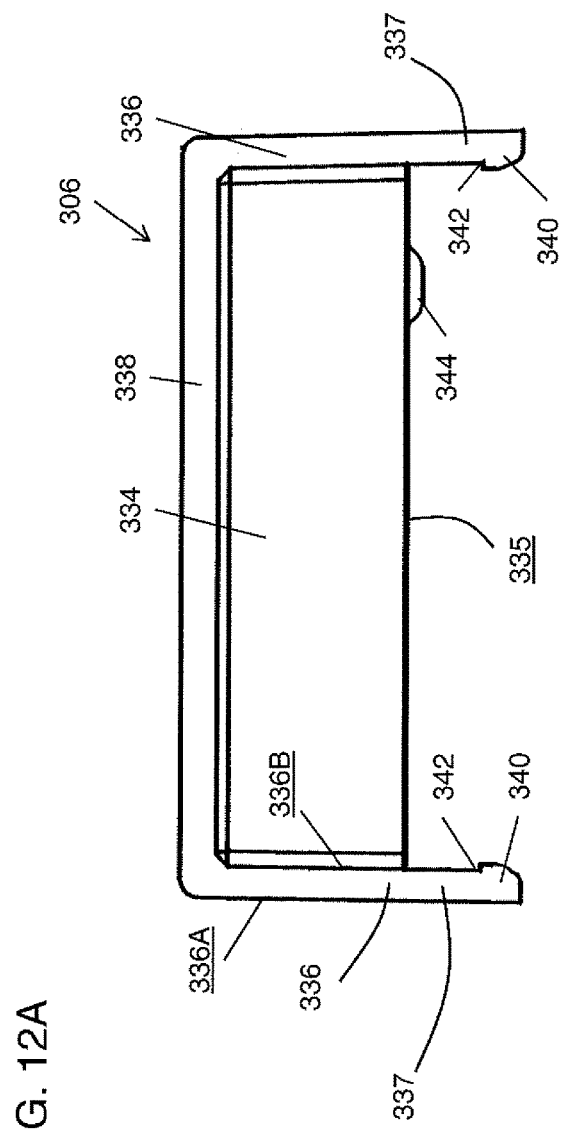
FIG. 12B shows a cutaway view of the case lid of the package of FIG. 10 taken along line B-B.

In particular, FIG. 10 shows a perspective view of an alternative electronic device package 300 that includes the molded case 302, a plurality of leads 304, and the case lid 306. FIGS. 11A-11D show different views of the molded case 302 and leads 304 without the case lid 306, and FIGS. 12A and 12B show different cutaway views of the case lid 306 without the molded case 302 and leads 304. More specifically, FIG. 11A shows a cutaway view of the case 302 and leads 304 taken along line A-A; FIG. 11B shows a cutaway view of the case 302 and leads 304 taken along line B-B; FIG. 11C shows a top plan view of the case 302 and leads 304; FIG. 11D shows a bottom plan view of the case 302 and leads 304; FIG. 12A shows a cutaway view of the case lid 306 taken along line A-A; and FIG. 12B shows a cutaway view of the case lid 306 taken along line B-B.

As shown in FIGS. 11A-11D, the molded case 302 including integrally formed side walls 308, end walls 310, and a bottom wall 312. The side walls 308, the end walls 310 and bottom wall 312 define an interior 314 of the case 302 that is configured to receive one or more electronic components, such as a toroidal transformer or the like, as is shown, for example, in FIG. 2. In this embodiment, the side walls 308, end walls 310, and bottom wall 312 are generally orthogonal to each other. It is understood, however, that the side walls 308, end walls 310, and bottom wall 312 can be integrally formed so as to define the interior 314 without being orthogonal to each other.

As shown in FIG. 11A, each of the side walls 308 includes a top portion 316 and a bottom portion 318. The top portion 316 of each side wall 308 comprises a plate-like structure having outer and inner surfaces 316A, 316B, respectively, that extend downwardly from a top edge 320 of the side wall 308. Like the top portion 316, the bottom portion 318 of each side wall 308 also comprises a plate-like structure having outer and inner surfaces 318A, 318B, respectively. The inner surface 318B of the bottom portion 318 extends downwardly from the inner surface 316B of the top portion 316 to the bottom wall 312. Accordingly, the inner surfaces 316B and 318B are coplanar, and collectively define an inner surface of the side wall 308 that delimits the interior 314. The outer surface 318A of the bottom portion 318 extends downwardly from a top surface 322 of the bottom portion 318 to a bottom edge 324 of the side wall 308. The top surface 322 of the bottom portion 318 extends outwardly from the outer surface 316A of the top portion 316 in a direction away from the interior 314. Accordingly, a thickness between the outer and inner surfaces 318A, 318B of the bottom portion 318 is greater than a thickness between the outer and inner surfaces 316A, 316B of the upper portion 316.

With reference to FIGS. 11A-11D, the leads 304 are molded into each of the side walls 308 from the bottom edge 324 to the top edge 320. Each of the leads 304 is formed of a length of electrically conductive, and pliable or malleable material, such as copper or phosphor bronze. Each lead 304 has a first end portion or post 326 extending above the top edge 320 of the side wall 308, and a second end portion or foot 328 extending along the bottom edge 324 of the side wall 308. An intermediate portion 332 of each lead 304, which is that portion of the lead 304 extending between the post 326 and the foot 328, is nearly completely encased in the side wall 308. Accordingly, the only portions of each lead 304 that are exposed externally of the molded case 302 are the post 326 and foot 328. Preferably, no part of the lead 304 is exposed within the interior 314 of the case 302.

As shown in FIG. 11B, the post 326 of each lead 304 includes a notch 330. In this embodiment, all of the notches 330 face in the same direction, toward one of the end walls 310 of the case 302, and are configured to facilitate wrapping a wire from a transformer (not shown) about the post 326 of each lead 304. As shown in FIGS. 11A and 11D, the foot 328 of each lead 304 extends along the bottom edge 324 of the side wall 308. In other words, the foot 328 of each lead 304 abuts the bottom edge 324, and is thus mechanically supported by the bottom portion 318 of each side wall 308. This arrangement of the foot 328 of each lead 304 is advantageous because it is relatively impervious to damage during placement on a circuit board.

With continued reference to FIG. 11B, each end wall 310 comprises a plate-like structure having outer and inner surfaces 310A, 310B, respectively. Each of the inner and outer surfaces 310A, 310B extends downwardly from a position substantially coplanar with the top edge 320 of the side wall 308 to the bottom wall 312. The outer surface 310A of each end wall 310 further includes a feature 346 formed into the outer surface 310A at the lower end of each end wall 310, near the bottom wall 312. In particular, the feature 346 includes an overhang 350, which defines a downwardly facing notch or step in the outer surface 310A of the end wall 310. Above the feature 346, the outer surface 310A of each of the end walls 310 extends upwardly and inwardly in an inclined manner from the feature 346 towards the top of the end wall 310A. The top of the end wall 310 is that portion which is arranged farthest from the bottom wall 312. As explained in further detail below, the slight slope of the outer surface 310A of each end wall 310 facilitates placement of the case lid 306 on the molded case 302, and the feature 346, more specifically the overhang 350, is configured to engage with the case lid 306 to secure the case lid 306 to the molded case 302.

Each end wall 310 further includes two ledges 352, each having a top surface 352A that is substantially coplanar with the top surface 322 of the bottom portion 318 of the side wall 308. Each ledge 352 also has an inwardly facing surface 352B, which faces toward the inwardly facing surface 352B of the opposite ledge 352 on the same end wall 310. The ledges 352 extend outwardly to relative to the outer surfaces 310A of the end walls 310 on either side of the feature 346 and the overhang 350. In other words, the ledges 352 extend in a direction away from the interior 314. In particular, each of the ledges 352 extends to an outer surface 352C, which is arranged outwardly of the outer surface 310A.

Referring to FIGS. 10, 12A and 12B, the case lid 306 includes side walls 334, end walls 336, and a top wall 338. As shown in FIG. 12A, each side wall 334 comprises a plate-like structure having outer and inner surfaces 334A, 334B, respectively, that extend downwardly from the top wall 338 to a bottom surface 335 of the side wall 334. Similarly, as shown in FIG. 12B, each end wall 336 comprises a plate-like structure having outer and inner surfaces 336A, 336B, respectively, that extend downwardly from the top wall 338. Each end wall 336 further includes a tab 337 defined by the outer and inner surfaces 336A, 336B. The tabs 337 extend farther downwardly from the top wall 338 than does either of the side walls 334. As shown in FIG. 10, the tab 337 extends along the width of the respective end wall 336, but does not necessarily extend across the entire width of the end wall 336. In other words, each tab 337 does not necessarily extend laterally all the way to each of the side walls 334.

As shown in FIGS. 12A and 12B, a detent 340 is formed in the inner surface 336B of each of the tabs 337 at the bottom portion of the end wall 336. The bottom portion of the end wall 336 is that portion which is arranged farthest from the top wall 338 of the case lid 306. Each detent 340 is configured to engage the feature 346 of the outer surface 310A of a respective end wall 310 (see FIG. 11B) of the molded case 302 to secure the case lid 306 on the molded case 302. Thus, in this embodiment, each detent 340 is configured to engage the notch or step defined by the overhang 350. Accordingly, each detent 340 defines an opposing upwardly facing notch 342 or step that is configured to engage the notch or step defined by the overhang 350. The notch 342 of each detent 340 faces inwardly, toward the notch 342 formed on the opposite end wall 336 of the lid 306. As shown in FIG. 12A, each detent 340 extends along the inner surface 336B of a respective end wall 336, but does not necessarily extend along the entire length of the tab 337 of the end wall 336.

In general, to assemble an electronic device that includes the package 300, the case 302 is fabricated with the plurality of leads 304 in place using any suitable molding technique. The lid 306 is also fabricated using suitable molding techniques. One or more electronic elements, not shown, but which may be transformers and/or coils, are disposed within the interior 314, preferably such that they rest on the bottom wall 312. For example, the toroids 12, 14 of FIG. 2 may suitably be disposed in the interior 314 on the bottom wall 312 in an analogous fashion to that shown in FIG. 2. Wires of the electronic elements, for example, wire ends 94 of the toroids 12 and 14 of FIG. 2, are wrapped around select ones of the posts 326. Thereafter, the case lid 306 is secured to the molded case 302.

Referring to FIGS. 10-12B, to secure the case lid 306 onto the molded case 302, the case lid 306 is arranged above the molded case 302 such that the inner surfaces 334B of the side walls 334 of the case lid 306 are aligned with the outer surfaces 316A of the top portions 316 of the side walls 308 of the molded case 302 and such that the inner surfaces 336B of the end walls 336 of the case lid 306 are aligned with the outer surfaces 310A of the end walls 310 of the molded case 302. In this arrangement, the detents 340 of the case lid 306 are brought into contact with the outer surfaces 310A of the end walls 310 of the molded case, and the case lid 306 is then pressed downwardly onto the molded case 302.

As the case lid 306 moves downwardly relative to the molded case 302, the slopes of the outer surfaces 310A of the end walls 310 force the detents 340 gradually outwardly, and thus flex the tabs 337 of the end walls 336 of the case lid 306 gradually outwardly. When the detents 340 clear the downwardly facing steps of the overhangs 350 of the features 346 on the end walls 310, the flexed tab 337 of each end wall 336 releases inwardly as the detents 340 enters the notches formed by the overhangs 350. The case lid 306 is thereby held in place on the molded case 302 by engagement of the upwardly facing notches 342 of the case lid 306 with the overhangs 350 of the molded case 302, and may remain in place without epoxy.

Thus, as shown in FIG. 10, the case lid 306 engages and snap fits onto the molded case 302 such that the case lid 306 extends over the interior 314, over a portion of each of the end walls 310, and over a portion of each of the side walls 308 of the molded case 302. Furthermore, when the case lid 306 is coupled to the molded case 302 in this manner, the bottom surface 335 of each side wall 334 of the case lid 306 is in contact with the top surface 322 of the bottom portion 318 of each side wall 308 of the molded case 302, and the outer surfaces 334A of the side walls 334 of the case lid 306 are generally coplanar with the outer surfaces 318A of the bottom portions 318 of the side walls 308 of the case lid 302.

Additionally, when the case lid 306 is coupled to the molded case 302 in this manner, the tab 337 of each of the end walls 336 of the case lid 306 is received between the ledges 352 of the corresponding end wall 310 of the molded case 302. Accordingly, each tab 337 is received between the inwardly facing surfaces 352B of the ledges 352 of the corresponding end wall 310 such that the portions of the end walls 336 of the case lid 306 above the tabs 337 rest on the top surfaces 352A of the ledges 352 of the end walls 310. In this arrangement, the outer surfaces 352C of the ledges 352 are substantially coplanar with the outer surface 336A of the end wall 336 of the case lid 306, and vertical seams 354 are formed where the outer surfaces 352C meet the outer surfaces 336A.

As shown in FIGS. 12A and 12B, the case lid 306 also includes a downwardly extending orientation tab 344, which projects downwardly from the bottom surface 335 one of the side walls 334 of the case lid 306. The orientation tab 344 is disposed nearer to one of the end walls 336 than to the other of the end walls 336. The orientation tab 344 is matingly received by a corresponding orientation receiver 348 formed in the top surface 322 of the bottom portion 318 of one of the side walls 308 of the molded case 302. In the embodiment shown, the case lid 306 only includes one orientation tab 344 and the molded case 302 only includes one orientation receiver 348. Accordingly, the mating engagement of the orientation tab 344 on the case lid 306 with the orientation receiver 348 of the molded case 302 serves to directionally orient the case lid 306 relative to the molded case 302 when the case lid 306 is coupled to the molded case 302. In alternative embodiments, it is possible for the case lid 306 and/or the molded case 302 to include other features configured to directionally orient the case lid 306 relative to the molded case 302.

While the package 300 of FIGS. 10-12B has sixteen leads 304 molded into the case 302, which is a typical surface mount dual in-line configuration, the same concepts may be implemented on devices with more or fewer leads. For example, FIGS. 13-15D show an alternative design of a package 400 having six leads.

Figure 13:
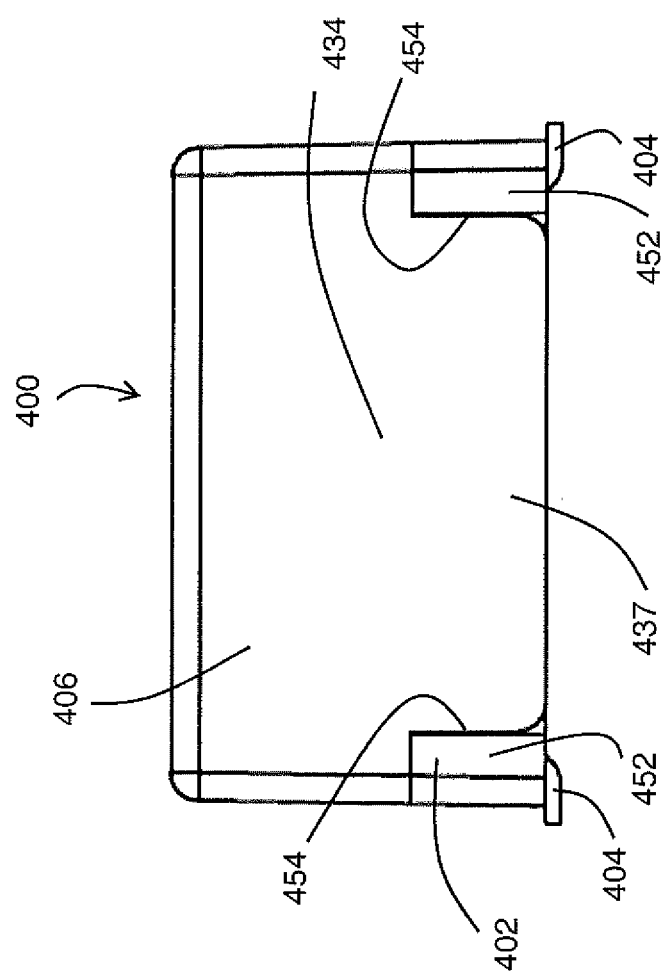
FIG. 13 shows a side elevational view of another alternative electronic device package.

FIG. 13 shows a side elevational view of the package 400. The package 400 is substantially similar in structure and function to the package 300, described above and shown in FIGS. 10-12B. FIG. 14A shows a top plan view of the molded case 402 of the package 400; FIG. 14B shows a cutaway view of the molded case 402 cut along the lines B-B in FIG. 14A; FIG. 14C shows a cutaway view of the molded case 402 cut along the lines C-C in FIG. 14A; and FIG. 14D shows a bottom plan view of the molded case 402. FIG. 15A shows a top plan view of the case lid 406 of the package 400; FIG. 15B shows a cutaway view of the case lid 406 cut along the lines B-B in FIG. 15A; FIG. 15C shows a cutaway view of the case lid 406 cut along the lines C-C in FIG. 15A; and FIG. 15D shows a bottom plan view of the case lid 406.

As noted above and shown in FIGS. 14A and 14D, the package 400 differs from the package 300 in that the package 400 includes six leads 404. Accordingly, it will be further appreciated that in further alternative embodiments, other arrangements are possible including more or fewer leads. Accordingly, it will be further appreciated that in further alternative embodiments, other arrangements of the leads molded into the molded case are possible.

Similar the package 300, the package 400 has a lid 406 having side walls 436, end walls 434, and a top wall 438. The end walls 434 include tabs 437, the detents 440, and the upwardly facing notches 442 analogous in structure and operation to the tabs 337, detents 440 and notches 342 of the device 300. Accordingly, the corresponding overhangs 450 are included on the end walls 408 of the molded case 402, (see FIG. 14B). As demonstrated by the different embodiments shown in the packages 300 and 400, both arrangements enable engagement of the case lid with the molded case. Accordingly, it will be further appreciated that in further alternative embodiments, other arrangements are possible which enable engagement of the case lid with the molded case.

Additionally, the package 400 includes an orientation tab 444 analogous in function to the orientation tab 344, formed on one of the side walls 436 of the case lid 406 (see FIG. 15D). Accordingly, the top and bottom portions 416, 418, and thus the corresponding orientation receiver 448, are formed on one of the side walls 410 of the molded case 402, rather than on the end walls 408 (see FIGS. 14A and 14C). As demonstrated by the different embodiments shown in the packages 300 and 400, both arrangements enable directional orientation of the case lid on the molded case. Accordingly, it will be further appreciated that in further alternative embodiments, other arrangements are possible which enable directional orientation of the case lid on the molded case.

The package 400 also differs from the package 300 in that an undersurface 439 of the top wall 438 of the case lid 406 is not flat, like the corresponding undersurface of the top wall 338 of the lid 306. Instead, as shown in FIGS. 15C and 15D, the undersurface 439 includes a set of three parallel width-wise ridges 456 forming four channels 458 in the undersurface 439. The channels 458 are oriented extending generally parallel to the side walls 436 of the case lid 406. It will be further appreciated that in further alternative embodiments, other arrangements of the undersurface of the case lid are possible.

It will be appreciated that the above-described embodiments are merely illustrative, and that those of ordinary skill in the art may readily device their own implementations and modifications that incorporate the principles of the present invention and fall within the spirit and scope thereof.

What is claimed is:

1. An electronic device package comprising:
   a molded case including integrally formed side walls, end walls, and a bottom wall, the side walls, end walls and bottom wall defining an interior configured to receive one or more electronic components, each side wall including a top portion and a bottom portion, the top portion comprising a plate-like structure having first and second surfaces extending downwardly from a top edge of the side wall, the bottom portion having: (i) a top surface that extends from the first surface in a direction away from the interior, (ii) a third surface extending downward from the top surface to a bottom edge of the side wall, and (iii) a fourth surface extending downward from the second surface to the bottom wall;
   leads molded in the side wall from the bottom edge to the top edge, each lead having a first end portion extending above the top edge, and each lead having a second end portion extending along the bottom edge; and
   a case lid configured to engage with and snap fit onto the molded case such that the case lid extends over the interior, over at least a portion of each of the end walls, and over at least a portion of each of the side walls; and
   wherein:
   each end wall has an outer surface and an inner surface, the case lid includes lid end walls, each lid end wall having a detent configured to engage a feature of the outer surface of a respective end wall of the molded case to secure the case lid on the molded case; and
   the case lid includes lid side walls are configured such that when the case lid is engaged with the molded case, the lid side walls extend adjacently to the top portion of the first surface of the side walls of the molded case, and the lid side walls terminate at the top surface of the bottom portion of the sides walls of the molded case.

2. The electronic device package of claim 1, wherein the first, second, third, and fourth surfaces extend substantially vertically downwardly.

3. The electronic device package of claim 1, wherein the bottom portion has a thickness that is greater than a thickness of the top portion.

4. The electronic device package of claim 3, wherein the fourth surface is substantially coplanar with the second surface of the top portion.

5. The electronic device package of claim 1, wherein the feature of the outer surface of the end wall of the molded case is an overhang.

6. An electronic device package comprising:
   a molded case including integrally formed side walls, end walls, and a bottom wall, the side walls, end walls and bottom wall defining an interior configured to receive one or more electronic components, each side wall including a top portion and a bottom portion, the top portion comprising a plate-like structure having first and second surfaces extending downwardly from a top edge of the side wall, the bottom portion having: (i) a top surface that extends from the first surface in a direction away from the interior, (ii) a third surface extending downward from the top surface to a bottom edge of the side wall, and (iii) a fourth surface extending downward from the second surface to the bottom wall;
   leads molded in the side wall from the bottom edge to the top edge, each lead having a first end portion extending above the top edge, and each lead having a second end portion extending along the bottom edge; and
   a case lid configured to engage with and snap fit onto the molded case such that the case lid extends over the interior, over at least a portion of each of the end walls, and over at least a portion of each of the side walls; and
   wherein:
   each end wall has an outer surface and an inner surface,
   the case lid includes lid end walls, each lid end wall having a detent configured to engage a feature of the outer surface of a respective end wall of the molded case to secure the case lid on the molded case; and
   the outer surface of the end wall of the molded case extends upwardly and inwardly in an inclined manner from the feature towards the top of the end wall of the molded case.

7. The electronic device package of claim 6, wherein:
   the case lid includes lid side walls configured such that when the case lid is engaged with the molded case:
   the lid side walls extend adjacently to the top portion of the first surface of the side walls of the molded case, and
   the lid side walls terminate at the top surface of the bottom portion of the sides walls of the molded case.

8. The electronic device package of claim 1, wherein:
   one of the lid side walls includes an orientation tab extending downwardly from a lowermost surface of the lid side wall, and
   the orientation tab is configured such that when the case lid is engaged with the molded case, the orientation tab matingly engages with a corresponding orientation receiver formed in the top surface of the bottom portion of a corresponding one of the side walls of the molded case.

9. The electronic device package of claim 8, wherein:
   the orientation tab is arranged nearer to one of the lid end walls than to the other of the lid end walls.

10. The electronic device package of claim 1, wherein:
    each lid end wall includes a tab extending downwardly from a main body portion of the lid end wall; and
    the detent is arranged on the tab.

11. The electronic device package of claim 10, wherein:
    each end wall of the molded case includes ledges extending outwardly from the outer surface of the end wall of the molded case; and
    the ledges are configured to receive the tab therebetween.

12. The electronic device package of claim 11, wherein:
    the ledges are configured such that the main body portion of the lid end wall is arranged above the ledges when the tab is received between the ledges.

13. The electronic device package of claim 11, wherein:
each of the ledges has a top ledge surface that is substantially coplanar with the top surface of the bottom portion of the side walls of the molded case.

14. The electronic device package of claim 11, wherein the feature of the outer surface of the respective end wall of the molded case is formed between the ledges of the same end wall.

15. The electronic device package of claim 11, wherein:
each of the lid end walls has an inner surface and an outer surface arranged directly opposite one another,
each of the detents is arranged on the inner surface of the corresponding lid end wall.

16. The electronic device package of claim 15, wherein:
each of the ledges has an outwardly facing ledge surface that extends downwardly from the top ledge surface and is generally orthogonal to the third surface of the side wall of the molded case, and
when the case lid is engaged with the molded case, the outwardly facing ledge surfaces are substantially coplanar with the outer surfaces of the lid end walls.

17. The electronic device package of claim 1, wherein:
each lid end wall includes a tab extending downwardly from a main body portion of the lid end wall; and
the detent is arranged on the tab.

18. The electronic device package of claim 17, wherein the at least one ridge extends along the underside in a direction that is substantially parallel to the lid end walls.

19. The electronic device package of claim 6, wherein:
each of the leads includes an intermediate portion extending between the first end portion and the second end portion, and
the intermediate portion of each of the leads is interposed between the first surface and the second surface and between the third surface and the fourth surface of the corresponding side wall into which the lead is molded.

20. The electronic device package of claim 4, wherein:
the case lid includes a top wall having a downwardly facing underside, and
the case lid includes at least one ridge extending downwardly from the underside.

* * * * *